(12) United States Patent
Lien et al.

(10) Patent No.: US 12,211,556 B2
(45) Date of Patent: Jan. 28, 2025

(54) INDEPENDENT SENSING TIMES

(71) Applicant: Micron Technology, Inc., Boise, ID (US)

(72) Inventors: Yu-Chung Lien, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 17/887,348

(22) Filed: Aug. 12, 2022

(65) Prior Publication Data
US 2024/0055054 A1    Feb. 15, 2024

(51) Int. Cl.
*G11C 11/34*    (2006.01)
*G11C 16/10*    (2006.01)
*G11C 16/12*    (2006.01)
*G11C 16/26*    (2006.01)

(52) U.S. Cl.
CPC ............ *G11C 16/12* (2013.01); *G11C 16/102* (2013.01); *G11C 16/26* (2013.01)

(58) Field of Classification Search
CPC ......... G11C 16/10; G11C 16/30; G11C 16/12; G11C 16/0483
USPC ....................................... 365/185.18, 185.19
See application file for complete search history.

(56) References Cited

U.S. PATENT DOCUMENTS

| | | | |
|---|---|---|---|
| 5,671,388 A | 9/1997 | Hasbun | |
| 7,719,889 B2 | 5/2010 | Lin | |
| 2014/0063940 A1* | 3/2014 | Chen | G11C 16/3418 365/185.17 |
| 2020/0202915 A1* | 6/2020 | Her | G11C 11/4085 |
| 2021/0158874 A1* | 5/2021 | Jang | G06F 3/0619 |
| 2021/0286554 A1 | 9/2021 | Gorobets et al. | |
| 2022/0139466 A1 | 5/2022 | Gorobets et al. | |

* cited by examiner

*Primary Examiner* — Son T Dinh
(74) *Attorney, Agent, or Firm* — Brooks, Cameron & Huebsch, PLLC

(57) ABSTRACT

A method includes determining that a program operation includes a first pass to apply a first voltage distribution to a plurality of memory cells and a second pass to apply a second voltage distribution to the plurality of memory cells, performing the first pass of the program operation using a first sensing time, and performing the second pass of the program operation using a second sensing time during the second pass of the program operation, where the first sensing time is shorter than the second sensing time.

18 Claims, 6 Drawing Sheets

INDEPENDENT SENSING TIMES

TECHNICAL FIELD

Embodiments of the disclosure relate generally to memory sub-systems, and more specifically, relate to independent sensing times.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
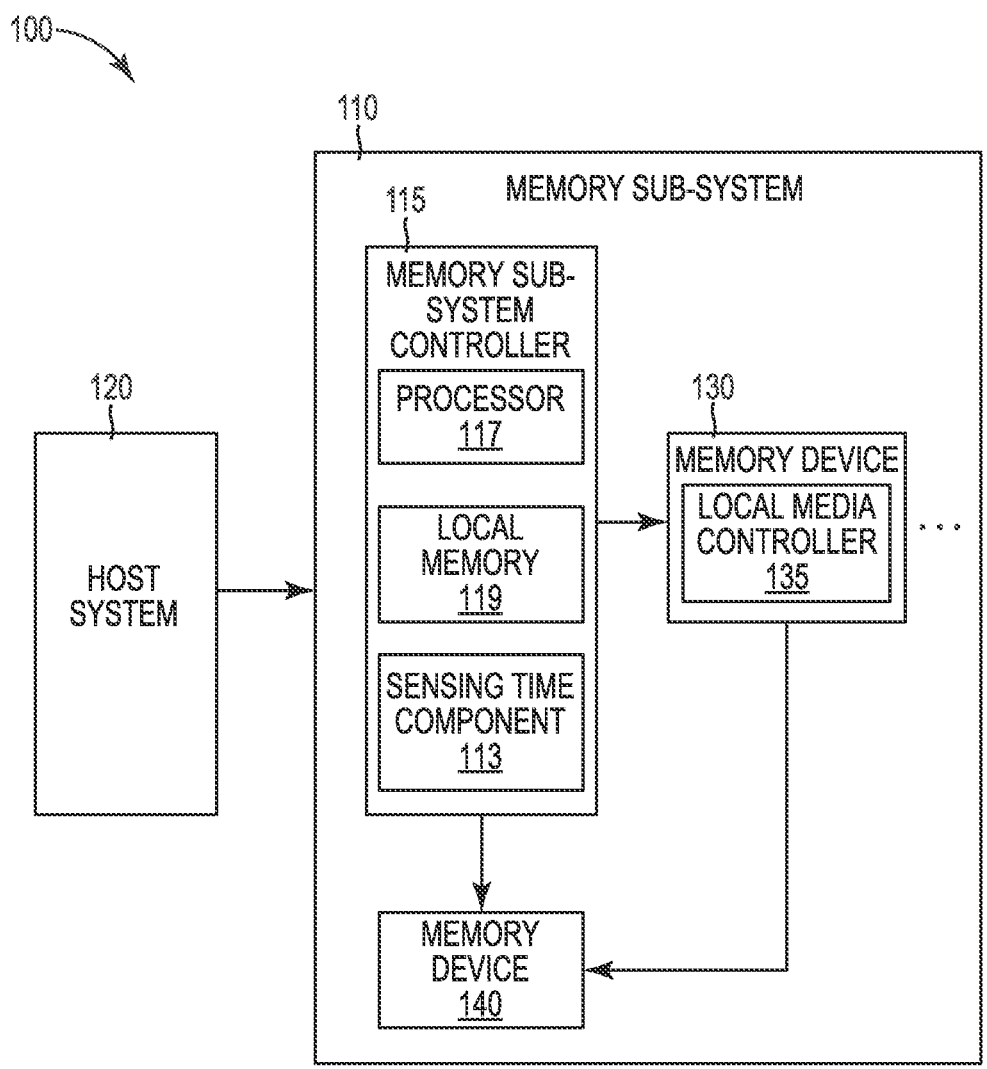
FIG. 1 illustrates an example computing system that includes a memory sub-system in accordance with some embodiments of the disclosure.

Aspects of the present disclosure are directed to independent sensing times for different program passes, in particular to memory sub-systems that include a sensing time component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

In some previous approaches, there can be a trade-off between reliability and performance when it comes to programming a memory device. In multiple program pass operations the memory blocks of the memory device can be programmed (e.g., have a voltage signal applied thereto) multiple times where each time is referred to as a programming pass. As used herein, a multiple program pass operation includes performing a programming operation or program pass on memory blocks multiple times to program the memory blocks. For example, in QLC memory devices, a two program pass operation can be performed over sixteen levels (e.g., threshold voltage levels that correspond to data states associated with a QLC memory cell). In this example, a first pass can be performed on the sixteen levels and a second pass can be performed on the same sixteen levels to program the sixteen levels of the QLC memory device.

In some embodiments, the two program pass operation can utilize a first pass that is referred to as a "coarse pass" or "coarse program pass" and utilize a second pass that is referred to as a "fine pass" or "fine program pass." In some embodiments, the coarse program pass operation is performed utilizing a first programming voltage to move the threshold voltage a first step and the fine program pass operation is performed utilizing a second programming voltage to move the threshold voltage a second step that is smaller than the first step. In this way, the coarse program pass operation may move the threshold voltage a relatively large voltage step to get the memory cell or memory block relatively close to the programmed state while the fine program pass operation may move the threshold voltage a relatively small voltage step to get the memory cell or memory block to a final programmed state.

In some embodiments, the data state of the memory device is not readable after the first pass or coarse program pass operation. In addition, the voltage placement is relatively less important than the fine program pass since the fine program pass is intended to move the threshold voltage to get the memory cell or memory block to the final programmed state. In this way, a multiple program pass operation can perform an initial or first program pass operation to shift or alter the threshold voltage a relatively large step to get the threshold voltage relatively close to the intended program state and then perform a subsequent or second program pass operation to tune the threshold voltage utilizing a relatively smaller voltage step to get the threshold voltage closer to the intended program state. Although two program pass operations are discussed and used as examples herein, the disclosure is not so limited. Additional program pass operations can be utilized where each program pass operation alters the threshold voltage to get closer to the intended program state.

The previous approaches utilize a sensing time (Tsense) for the multiple program pass operations. The sensing time is a quantity of time a sensing circuit is to perform a sensing operation. The sensing operation includes a determination of an electrical characteristic of a memory device such as a memory cell or memory block. For example, the sensing time can be a quantity of time that is designated for the sensing circuit to determine a threshold voltage of the memory device. In these embodiments, the accuracy of the threshold voltage can be affected by the quantity of sensing time the sensing circuit is allowed to perform the sensing operation. By utilizing the same sensing time during the coarse pass and the fine pass, the previous approaches can take relatively more time compared to the present disclosure.

Aspects of the present disclosure address the above and other deficiencies by employing independent sensing times. For instance, independent sensing times are assigned to each of the plurality of program pass operations to lower the quantity of time to perform a programming operation without sacrificing reliability or accuracy of the intended program state. In some embodiments the first pass or initial pass of a multiple program pass operation is not readable, the voltage placement is less important than the subsequent passes of the multiple program pass operation. In this way, a determination is made upon initiation of a multiple program pass operation whether the operation is at an initial program pass operation or a subsequent program pass operation. When the multiple program pass operation is performing an initial pass or coarse pass, the sensing time can be altered to a shorter sensing time than a default sensing time. When the multiple program pass operation is performing a subsequent pass or a fine pass, the sensing time can be the default sensing time. In this way, the time spent performing a sensing operation during an initial or coarse program pass operation can be decreased without affecting reliability or accuracy since the subsequent pass or fine pass will alter the threshold voltages to the intended voltage state.

In addition, a programming voltage step can be altered in response to determining the multiple program pass operation is performing an initial program pass operation. For example, the programming voltage step can be altered for particular levels of a memory device. In some embodiments, a first programming voltage step can be utilized for a first level of a memory device and a second programming voltage step can be utilized for a second level of the memory device. In some embodiments, the first level and the second level of the memory device can be adjacent levels of a memory device. In a specific example, for two adjacent levels of a NAND memory cell (e.g., L0 and L1), E0 corresponds to a voltage difference between a threshold read voltage at a given raw bit error rate (RBER) and the level L0. Similarly, E1 corresponds to a voltage difference between the threshold read voltage at a given raw bit error rate (RBER) and the level L1. In general, V0=E0+E1 (or, more generally, Vx=E2x+E2x+1). As will be appreciated, the levels L0 and L1 can represent portions of a voltage distribution curve associated with programming voltages of a memory cell. Accordingly, the values V0, E0, and E1 can be indicative of a programming voltage with respect to a voltage valley located between the levels L0 and L1. Further, it will be appreciated that, for MLCs, TLCs, etc., more than two levels (e.g., L0 to Ly) and hence, more than two "E" values (e.g., E0 to E2y−1), as well as more than one "V" (e.g., V0 to Vx) are contemplated within the scope of the disclosure. In an illustrative TLC example, where there are eight levels (L0 to L7), there are seven valleys (V0 to V6) and thirteen edges (E0 to E13) associated with the overall read budget window.

In some embodiments, for a QLC, there can be sixteen levels (L0 to L15), with fourteen valleys (V0 to V13) and twenty-six edges (E0 to E25). In these examples, an increased voltage step can be applied for levels that exceed a threshold level when the initial program pass operation is to be performed. In a specific example, when utilizing a QLC, the threshold level can be L14. In this specific example, a first programming voltage increase or first voltage step can be utilized from L13 to L14 and a second programming voltage increase or second voltage step can be utilized from L14 to L15. In this specific example, the second voltage step can be greater than the first voltage step. For example, the second voltage step can be two times greater than the first voltage step. In some embodiments, increasing the voltage step for levels that are greater than a threshold level can allow the sensing time for the initial program pass operation to be decreased to a lower quantity of time compared to embodiments that maintain the voltage step for levels that are greater than the threshold level.

FIG. 1 illustrates an example computing system 100 that includes a memory sub-system 110 in accordance with some embodiments of the disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single-level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, a MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

As described above, the memory components can be memory dice or memory packages that form at least a portion of the memory device 130. In some embodiments, the blocks of memory cells can form one or more "superblocks." As used herein, a "superblock" generally refers to a set of data blocks that span multiple memory dice and are written in an interleaved fashion. For instance, in some embodiments each of a number of interleaved NAND blocks can be deployed across multiple memory dice that have multiple planes and/or pages associated therewith. The terms "superblock," "block," "block of memory cells," and/or "interleaved NAND blocks," as well as variants thereof, can, given the context of the disclosure, be used interchangeably.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140. For instance, in some embodiments, the memory device 140 can be a DRAM and/or SRAM configured to operate as a cache for the memory device 130. In such instances, the memory device 130 can be a NAND.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device. The memory sub-system 110 can also include additional circuitry or components that are not illustrated.

The memory sub-system 110 can include a sensing time component 113, which may be referred to in the alternative as a "controller," herein. Although not shown in FIG. 1 so as to not obfuscate the drawings, the sensing time component 113 can include various circuitry to facilitate aspects of media management, as detailed herein. In some embodiments, the sensing time component 113 can include special purpose circuitry in the form of an ASIC, FPGA, state machine, and/or other logic circuitry that can allow the sensing time component 113 to orchestrate and/or perform the operations described herein.

In some embodiments, the memory sub-system controller 115 includes at least a portion of the sensing time component 113. For example, the memory sub-system controller 115 can include a processor 117 (processing device) configured to execute instructions stored in local memory 119 for performing the operations described herein. In some embodiments, the sensing time component 113 is part of the memory sub-system 110, an application, or an operating system.

In a non-limiting example, an apparatus (e.g., the computing system 100) can include a sensing time component 113. The sensing time component 113 can be resident on the memory sub-system 110. As used herein, the term "resident on" refers to something that is physically located on a particular component. For example, the sensing time component 113 being "resident on" the memory sub-system 110 refers to a condition in which the hardware circuitry that comprises the sensing time component 113 is physically located on the memory sub-system 110. The term "resident on" can be used interchangeably with other terms such as "deployed on" or "located on," herein.

The sensing time component 113 can be configured to identify a plurality of programming passes to be performed on the non-volatile memory blocks during a programming operation. Identifying the plurality of programming passes can include determining when a programming operation is a multiple program pass operation. That is, the programming operation can include at least a first pass that can be a coarse programming pass and at least a second pass that can be a fine programming pass. In this way, a first programming pass can be utilized to set a threshold voltage relatively close to an intended voltage state while the second programming pass can be utilized to tune the threshold voltage to the intended voltage state or to a final voltage state that corresponds to a data value to be stored by one or more memory cells contained within the non-volatile memory blocks.

Although examples described herein reference two programming passes, a plurality of additional programming passes can be utilized in a similar way and utilize the sensing time component 113 to alter a sensing time such that each of the plurality of programming passes utilize a corresponding sensing time. That is, the sensing time component 113 can be configured to determine a plurality of corresponding sensing times for each of the plurality of programming passes. In these embodiments, the plurality of corresponding sensing times are each different and independent sensing times or quantities of time to perform a sense operation that correspond to each of the plurality of programming passes.

The sensing time component 113 can be configured to determine a first type of a first programming pass of the plurality of programming passes. In some embodiments, the plurality of programming passes can be categorized into one of a plurality of programming pass types. For example, an initial programming pass can be categorized as a coarse programming pass and a subsequent programming pass can be categorized as a fine programming pass. However, the plurality of programming passes can be categorized based on a voltage step utilized during the corresponding programming pass. For example, a first programming pass can be categorized as a coarse programming pass when the voltage step exceeds a voltage step threshold, and a second programming pass can be categorized as a fine programming pass when the voltage step is less than the voltage step threshold.

The sensing time component 113 can be configured to control performance of the first programming pass using a first sensing time based on the first type. In some embodiments the sensing time component 113 can be configured to designate the first sensing time to the first programming pass based on the determination that the first programming pass is the first type. As described herein, the sensing time component 113 can be configured to determine when the first programming pass is an initial programming pass and/or a coarse programming pass and designate the first sensing time to be utilized during the first programming pass. In some embodiments, the sensing time component 113 can alter a default sensing time to a sensing time that is less than the default sensing time. As used herein, a default sensing time can be a designated sensing time for a programming pass associated with a particular memory device and/or a particular programming operation. In this way, the sensing time component 113 can alter the default sensing time to the first sensing time when it is determined that the first programming pass is the first type of programming pass.

The sensing time component 113 can be configured to determine a second type of a second programming pass of the plurality of programming passes. As described herein, the sensing time component 113 can determine the type of the second programming pass based on whether a previous programming pass has been performed and/or based on the voltage step to be utilized during the second programming pass. In one embodiment, the second type of programming pass can be a fine programming pass operation. As described herein, the type of programming pass can be determined based on a sequence of the programming pass with respect to the plurality of programming passes. For example, the designated sensing time for a particular programming pass can be lower when the particular programming pass is performed earlier in the sequence compared to different programming passes that are performed later in the sequence. As used herein, a sequence of programming passes includes the order that the programming passes are performed on the memory device or memory blocks.

That is, a first programming pass can be performed before a second programming pass. In this example, the sensing time for the first programming pass can be altered to be less than the sensing time of the second programming pass. In this way, the first programming pass has a first sensing time and the second programming pass has a second sensing time that is greater than the first sensing time. When additional programming passes are added to the sequence, the corresponding sensing times of the additional programming passes can be adjusted based on the corresponding position within the sequence.

The sensing time component 113 can be configured to control performance of the second programming pass using a second sensing time based on the second type. As described herein, the second type of programming pass can be a fine programming pass or a subsequent programming pass to the first programming pass. When the second type of programming pass is a fine programming pass, the sensing time component 113 can control the performance of the second programming pass by designating the second sensing time to be utilized during the second programming pass. In some embodiments, the second sensing time can be a greater quantity of time than the first sensing time. In some embodiments, the second sensing time is a default sensing time for programming passes for the memory device, although embodiments are not so limited.

Figure 2:
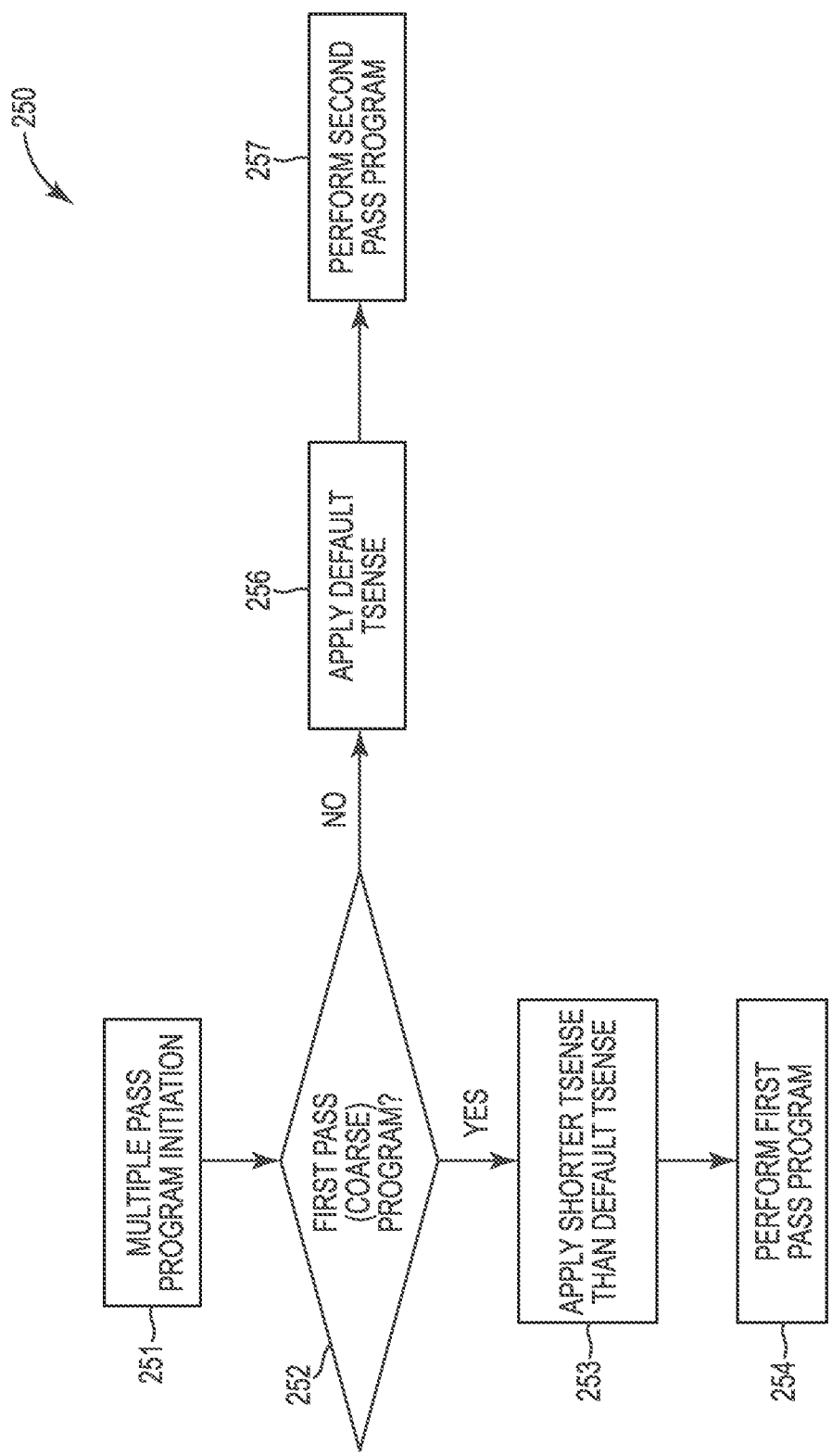
FIG. 2 illustrates a flow diagram for independent sensing times in accordance with some embodiments of the disclosure.

FIG. 2 illustrates a flow diagram 250 for independent sensing times in accordance with some embodiments of the disclosure. The flow diagram 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the flow diagram 250 is performed by the sensing time component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 251, the flow diagram 250 can be executed to initiate a multiple program pass operation. As described herein, a multiple program pass operation includes a programming operation that utilizes a plurality of separate programming passes that each provide a programming voltage to alter a voltage threshold of a plurality of memory cells. In one non-limiting example, the multiple program pass operation is performed on a QLC to alter a voltage threshold of a plurality of memory cells utilizing a corresponding program voltage for each of the multiple program passes.

At operation 252, the flow diagram 250 can be executed to determine when a particular programming pass of the multiple program pass operation is a first program pass operation. As described herein, the first program pass operation can be referred to as a coarse program pass operation. In some embodiments, the coarse program pass operation is determined based on a sequence of the multiple program pass operation. For example, a program pass operation can be designated as a coarse program pass when the program pass operation to be performed is the first in a sequence of program passes to be performed. That is, when the program pass is an initial program pass to be subsequently followed by an additional program pass or a plurality of additional program passes of the multiple program pass operation, the program pass is designated as a coarse program pass. In other embodiments, a particular program pass can be designated as a coarse program pass based on a program voltage to be utilized by the particular program pass. That is, the particular program pass can be designated a coarse program pass when the program voltage of the particular program pass is greater than a threshold program voltage.

When a program pass is determined to be a coarse program pass, the flow diagram 250 can move to operation 253 and when the program pass is determined to be a fine program pass or a non-coarse program pass, the flow diagram 250 can move to operation 253.

At operation 253, the flow diagram 250 can be executed to apply a shorter sensing time (Tsense) than a default sensing time. As described herein, a default sensing time can be designated for a programming operation for the memory resource. In this way, a coarse program pass operation can be performed with a sensing time that is less than a fine program pass operation. Once the short sensing time is assigned for the coarse program pass, the flow diagram 250 can move to operation 254.

At operation 254, the flow diagram 250 can be executed to perform the first program pass operation utilizing the sensing time that is shorter than the default sensing time. As described herein, when the programming pass is designated as a subsequent programming pass or a fine programming pass, the flow diagram 250 can conversely move to operation 256 instead of operation 253.

At operation 256, the flow diagram 250 can apply a default sensing time to the program pass operation that is determined to not be a first program pass operation and/or determined to not be a coarse program pass. In some embodiments the sensing time applied to the non-coarse program pass can be longer than the sensing time applied to the coarse program pass at operation 253. At operation 257, the flow diagram 250 can perform the non-coarse program pass utilizing the default sensing time and/or relatively longer sensing time.

Figure 3:
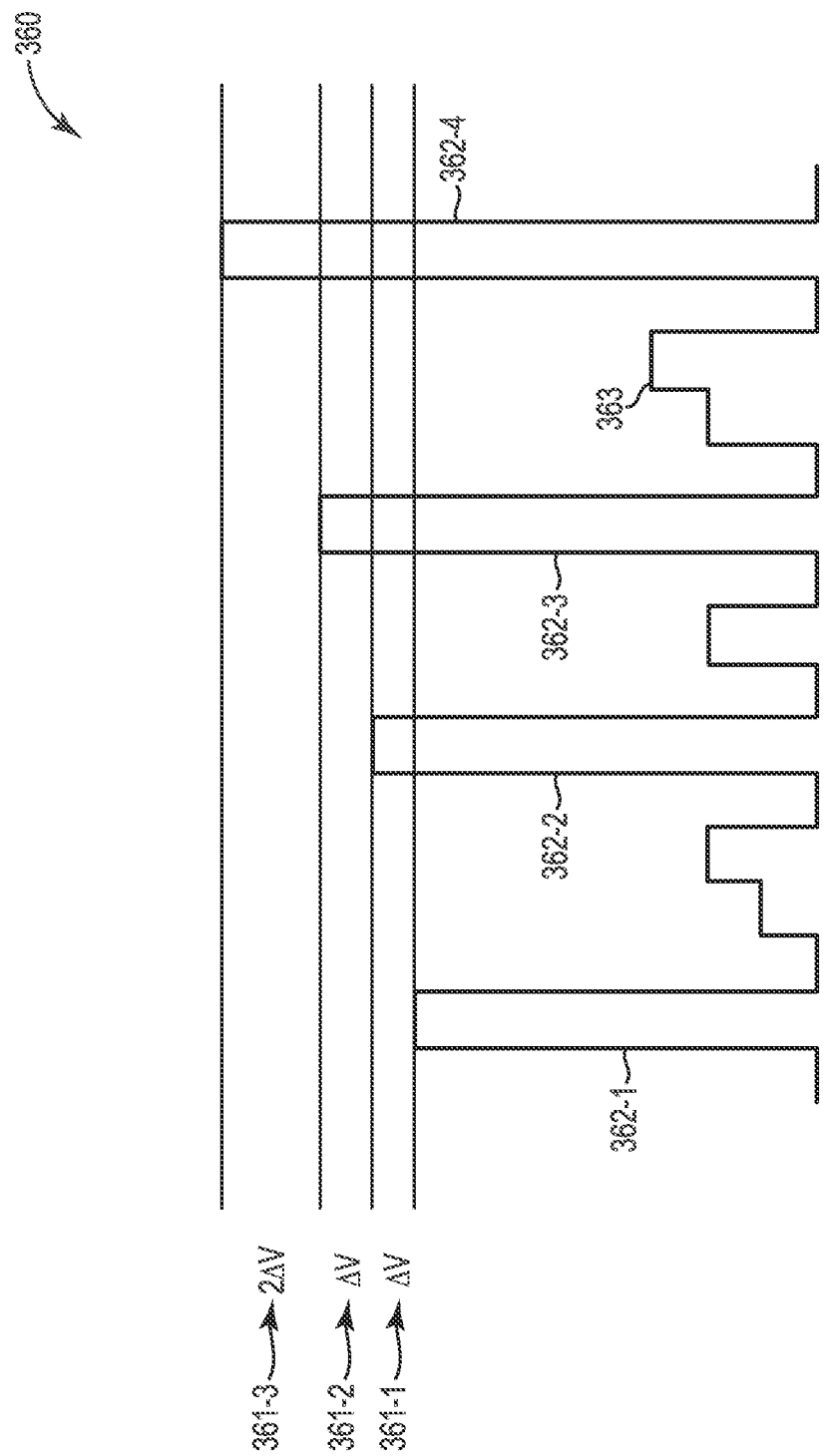
FIG. 3 illustrates a graph of incremental step pulse programming for independent sensing times in accordance with some embodiments of the disclosure.

FIG. 3 illustrates a graph 360 of incremental step pulse programming for independent sensing times in accordance with some embodiments of the disclosure. As described herein, an independent sensing time can be applied to a plurality of different program pass operations. When a default sensing time is lowered to a particular sensing time associated with a coarse program pass operation a voltage step can be altered for particular levels of the memory device.

The graph 360 illustrates a plurality of voltage programming steps 361-1, 361-2, 361-3 associated with threshold voltages 362-1, 362-2, 362-3, 362-4 associated with corresponding levels of a memory device. The graph 360 illustrates a first voltage programming step 361-1 from a first threshold voltage 362-1 to a second threshold voltage 362-2. The first voltage programming step 361-1 can represent a delta voltage (e.g., a change in voltage) from a first level represented by the first threshold voltage 362-1 to a second level represented by the second threshold voltage 362-2. The second voltage programming step 361-2 can represent a delta voltage from the second level represented by the second threshold voltage 362-2 to a third level represented by the third threshold voltage 362-3. In some embodiments the first voltage programming step 361-1 and the second voltage programming step 361-1 can be the same or similar delta voltage.

The graph 360 illustrates the third voltage programming step 361-3 that can be represented by a delta voltage from the third level represented by the third threshold voltage 362-3 to the fourth level represented by the fourth threshold voltage 362-4. As illustrated in graph 360, the third voltage programming step 361-3 can be greater than the first voltage programming step 361-1 and/or the second voltage programming step 361-2. In some embodiments, the third voltage programming step 361-3 can be two times greater than the first voltage programming step 361-1 or two times greater than the second voltage programming step 361-2. Said differently, the step program voltage can be increased during a coarse program pass from a step voltage (e.g., second voltage programming step 361-2) prior to the threshold voltage to a second step voltage (e.g., third voltage programming step 361-3) over the threshold voltage, wherein the first step voltage is half of the second step voltage.

As described herein, the third voltage programming step 361-3 can be executed for a particular level that is greater than a threshold level. In a specific example, the threshold level can be level 14 in a QLC. In this example, the QLC can include 16 levels (e.g., levels 0 to 15) and levels above level 14 can be provided with the third voltage programming step 361-3 compared to levels that are at or below level 14, which can be provided the voltage step of the first voltage programming step 361-1 or the second voltage programming step 361-2. In this specific non-limiting example, the first threshold voltage 362-1 can represent level 12, the second threshold voltage 362-1 can represent level 13, the third threshold voltage 362-3 can represent level 14, and the fourth threshold voltage 362-4 can represent level 15.

In some embodiments, the graph 360 represents verifying between the threshold voltages 362-1, 362-2, 362-3, 362-4. For example, a verifying voltage 363 can be performed to verify the threshold voltage 362-3. In this example, the verifying voltage 363 can be utilized to determine that the level associated with the threshold voltage 362-3 is greater than the threshold level such that the third voltage programming step 361-3 can be applied to the threshold voltage 362-4 since the level associated with the threshold voltage 362-4 is greater than the threshold level. In this way, a greater voltage programming step can be applied to levels that are greater than the threshold level.

Applying a greater voltage programming step to levels that are greater than the threshold level can allow the sensing time for the coarse program pass to be lowered further than maintaining the voltage step for levels greater than the threshold level. In a non-limiting example, the default sensing time for the coarse program pass and the fine program pass can be 1.26 microseconds. As described further herein, the sensing time can be altered to a lower sensing time when the coarse program pass is detected, and the lower sensing time can be applied and utilized during the coarse program pass. In the non-limiting example, the lowered sensing time for the coarse program pass can be 0.9 microseconds when the voltage programming step is maintained for levels greater than the threshold level. Furthermore, in the non-limiting example, the lowered sensing time for the coarse program pass can be 0.66 microseconds when the voltage programming step is increased for levels greater than the threshold level. In this way, the sensing time for the coarse program pass can be lowered further by increasing the voltage programming step for levels that are greater than a threshold level. In this way, the sensing time designated for a coarse program pass can be at least twenty-five percent less than the sensing time designated for a fine program pass.

Figure 4:
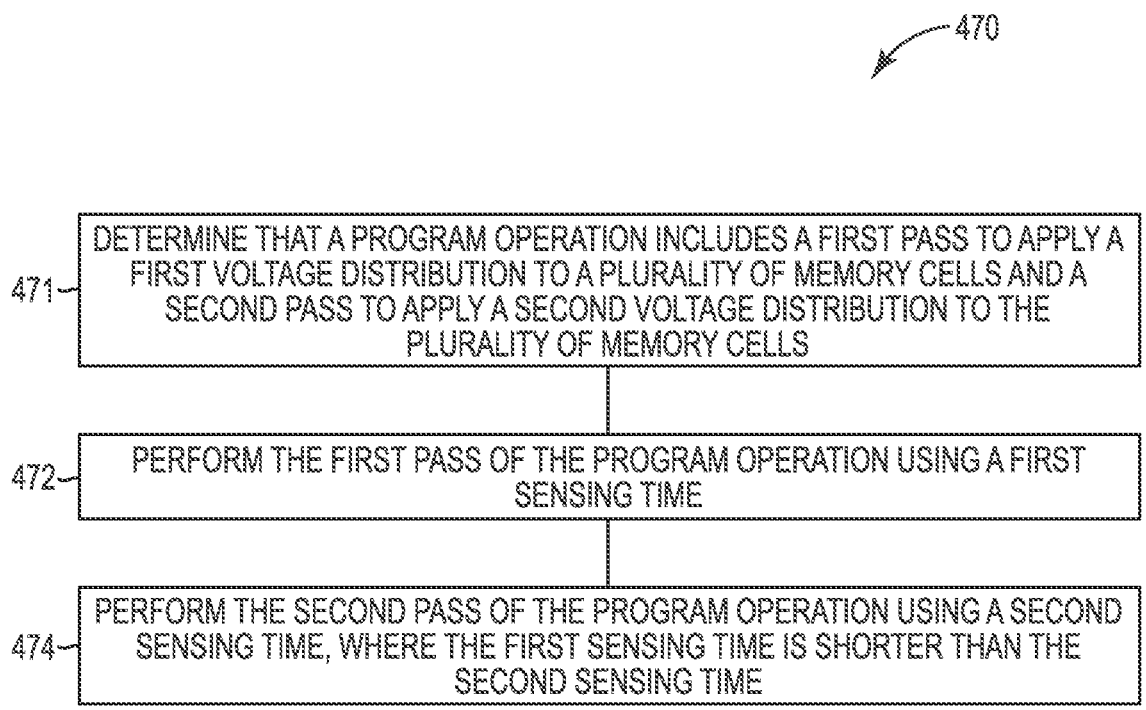
FIG. 4 is a flow diagram corresponding to a method for independent sensing times in accordance with some embodiments of the disclosure.

FIG. 4 is a flow diagram corresponding to a method 470 for independent sensing times in accordance with some embodiments of the disclosure. The method 470 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 470 is performed by the sensing time component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 471, the method 470 can be executed to determine that a program operation includes a first pass to apply a first voltage distribution to a plurality of memory cells and a second pass to apply a second voltage distribution to the plurality of memory cells. The first pass can apply a first voltage distribution that includes a first program voltage step and the second pass can apply a second voltage distribution that includes a second program voltage step. In some embodiments, the first pass is a coarse pass that utilizes a relatively large program voltage step to bring the threshold voltage of the memory cells to relatively close to the intended threshold voltage. In these embodiments, the second pass is a fine pass that utilizes a relatively lower program voltage step to bring the threshold voltage from the first pass closer to the intended threshold voltage or to a finalized threshold voltage for the plurality of memory cells.

In some embodiments, the method 470 determines that the program operation includes multiple passes including the first pass and the second pass. As described herein, a plurality of additional passes could be utilized to provide the intended threshold voltage to the plurality of memory cells. In these embodiments, the method 470 can determine when the program operation includes more than one pass. As described further herein, the method 470 can determine whether a particular pass is a coarse pass or a fine pass based on the properties of the plurality of passes.

At operation 472, the method 470 can be executed to perform the first pass of the program operation using a first sensing time. Performing the first pass of the program operation using the first sensing time can include determining the first pass is an initial pass or a coarse pass of the program operation. When it is determined that the first pass is an initial pass or a coarse pass, the method 470 can use the first sensing time that is shorter or less than a default sensing time for the program operation. As described herein, a sensing time component 113 can be utilized to alter a sensing time for each of a plurality of passes of a program operation. In some embodiments, the method 470 can alter the first sensing time based on the voltage programming step to be utilized during the first pass. As described herein, the sensing time can be altered to a particular sensing time that is shorter than a default sensing time when the voltage programming step is maintained for all levels of the memory cells while a different sensing time that is shorter than the particular sensing time when the voltage programming step is increased for levels that are greater than a threshold level of the memory cells.

At operation 474, the method 470 can be executed to perform the second pass of the program operation using a second sensing time where the first sensing time is shorter than the second sensing time. As described herein, the second pass of the program operation can be a subsequent pass of the program operation to the first pass of the program operation. In this way, the second pass can be a fine pass of the program operation when the first pass is a coarse pass of the program operation. As described herein, the method 470 can designate the second pass to have a default sensing time for the program operation, which is greater than the shortened sensing time designated for a coarse pass. In this way, the second sensing time is longer or greater than the first sensing time.

In some embodiments, the method 470 can be executed to perform the program operation from a source region of the plurality of memory cells to a drain region of the plurality of memory cells. As used herein, the source region of the plurality of memory cells can be a region of the memory cells that are coupled to an electrical source of an electrical circuit. In other embodiments, the method 470 can be executed to perform the program operation from a drain region of the plurality of memory cells to a source region of the plurality of memory cells. In this way, the method 470 can utilize different directions of a program sequence that is either source to drain or drain to source.

In some embodiments, the method 470 can be executed to apply a corresponding sensing time to a plurality of additional passes of the program operation based on a sequence of the additional passes of the program operation. As described herein, the program operation can include additional passes in addition to the first pass and the second pass. In these embodiments, the additional passes can each be designated an independent sensing time based on the sequence or order of the plurality of passes of the program operation.

The method 470 can be executed to alter a program voltage associated with the first pass of the program operation to a second program voltage when performing the second pass of the program operation. As described herein, the program voltage associated with the first pass or a coarse pass can be different than the second pass or fine pass. In a non-limiting example, the program voltage can be altered to allow for a relatively larger voltage step for the first pass to a relatively smaller voltage step for the second pass.

The method 470 can be executed to use the second sensing time in response to determining that the first pass of the program operation is complete. That is, the method 470 can determine when the first pass of the program operation is complete, determine the second pass is not a coarse pass, and perform the second pass using the second sensing time. In some embodiments, the second sensing time is a default sensing time for the program operation.

Figure 5:
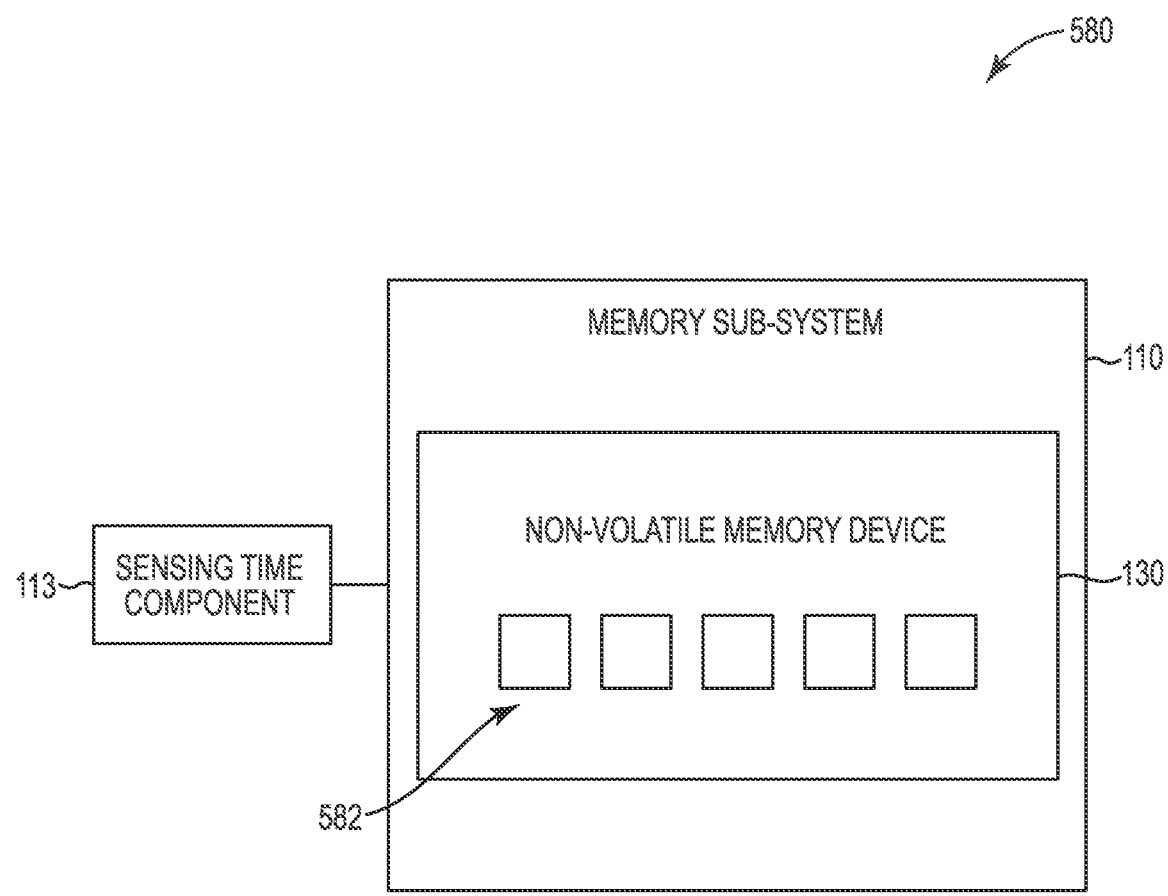
FIG. 5 illustrates an example computing system that includes a memory sub-system in accordance with some embodiments of the disclosure.

FIG. 5 illustrates an example computing system 580 that includes a memory sub-system 110 in accordance with some embodiments of the disclosure. The memory sub-system 110 can include a non-volatile memory device 130 that includes a plurality of non-volatile memory blocks 582. In some embodiments, the computing system 580 includes a sensing time component 113. The sensing time component 113 can be the same or similar hardware as the sensing time component 113 of FIG. 1. The sensing time component 113 can act as a processing device that is coupled to the memory sub system 110.

The sensing time component 113 can be configured to determine a programming operation is to be performed on the non-volatile memory blocks 582. As described herein, a programming operation is an operation for programming the memory blocks 582 with a particular threshold voltage that can indicate a particular value for storing data. As used herein, a memory cell can store one or more bits of data used by a host system. Furthermore, the memory cells of the memory devices can be grouped as memory pages or memory blocks that can refer to a unit of the memory component used to store data. The non-volatile memory blocks 582 can refer to a smallest erase unit on NAND, a block can consist of a collection of NAND pages which can be written sequentially from 0 to N. In some embodiments the non-volatile memory blocks 582 can each include a plurality of memory cells.

The sensing time component 113 can be configured to determine a first program pass of the programming operation is a coarse program pass. As described herein, the sensing time component 113 can determine that a particular program pass is a type of program pass that is referred to as a coarse program pass. The coarse program pass can refer to an initial program pass performed for a particular programming operation. In some embodiments, the coarse programming pulse is an initial programming step that utilizes a largest voltage on the word line of a memory device 130. Thus, the maximum program disturb is experienced on the first programming pulse since the effects on neighboring cells of the memory blocks 582 can be fixed with smaller, less disturbing programming pulses referred to as a fine program pass.

The sensing time component 113 can be configured to decrease a sensing time from an initial sensing time for the first program pass in response to the first program pass being the coarse program pass. As described herein, the initial sensing time can be a default sensing time utilized for the programming operation. The initial sensing time for the first program pass can be decreased or lowered when the first program pass is a coarse program pass. The sensing time for the coarse program pass can be decreased since a coarse program pass is followed by a fine program pass to fix the effects of the coarse program pass.

The sensing time component 113 can be configured to increase a step program voltage for the first program pass after a threshold level in response to the first program pass being the coarse program pass. As described herein, the memory blocks 582 can include a plurality of levels. A threshold level can be designated for the memory blocks based on the quantity of levels associated with the memory blocks 582. In a non-limiting example, the memory blocks 582 can be a QLC that includes 16 levels (L0-L15) where level 14 (L13) is designated as a threshold level. In this non-limiting example, a first step program voltage can be utilized for L 0-13 and a second step program voltage is utilized for L14.

The sensing time component 113 can be configured to determine a second program pass of the programming operation is a fine program pass. As described herein, a fine program pass can utilize a relatively smaller voltage pulse or fine pulses to move each cell's respective threshold voltage to the final state in smaller increments compared to the coarse program pass. The smaller programming voltages cause less of an impact on neighboring cells. For example, the threshold voltages are moved in increments of a tenth volt or less during the fine programming instead of the volt or multiple volt increments of the coarse programming.

The sensing time component 113 can be configured to apply the initial sensing time for the second program pass in response to the second program pass being the fine program pass. As described herein, the fine program pass can utilize a default sensing time compared to the lower sensing time of the coarse pass. As described herein, the fine program pass can be designated to alter the threshold voltages to a final threshold voltage without impacting neighboring cells. In these embodiments, the relatively larger sensing time can be implemented to ensure the accuracy of the final threshold voltages.

Figure 6:
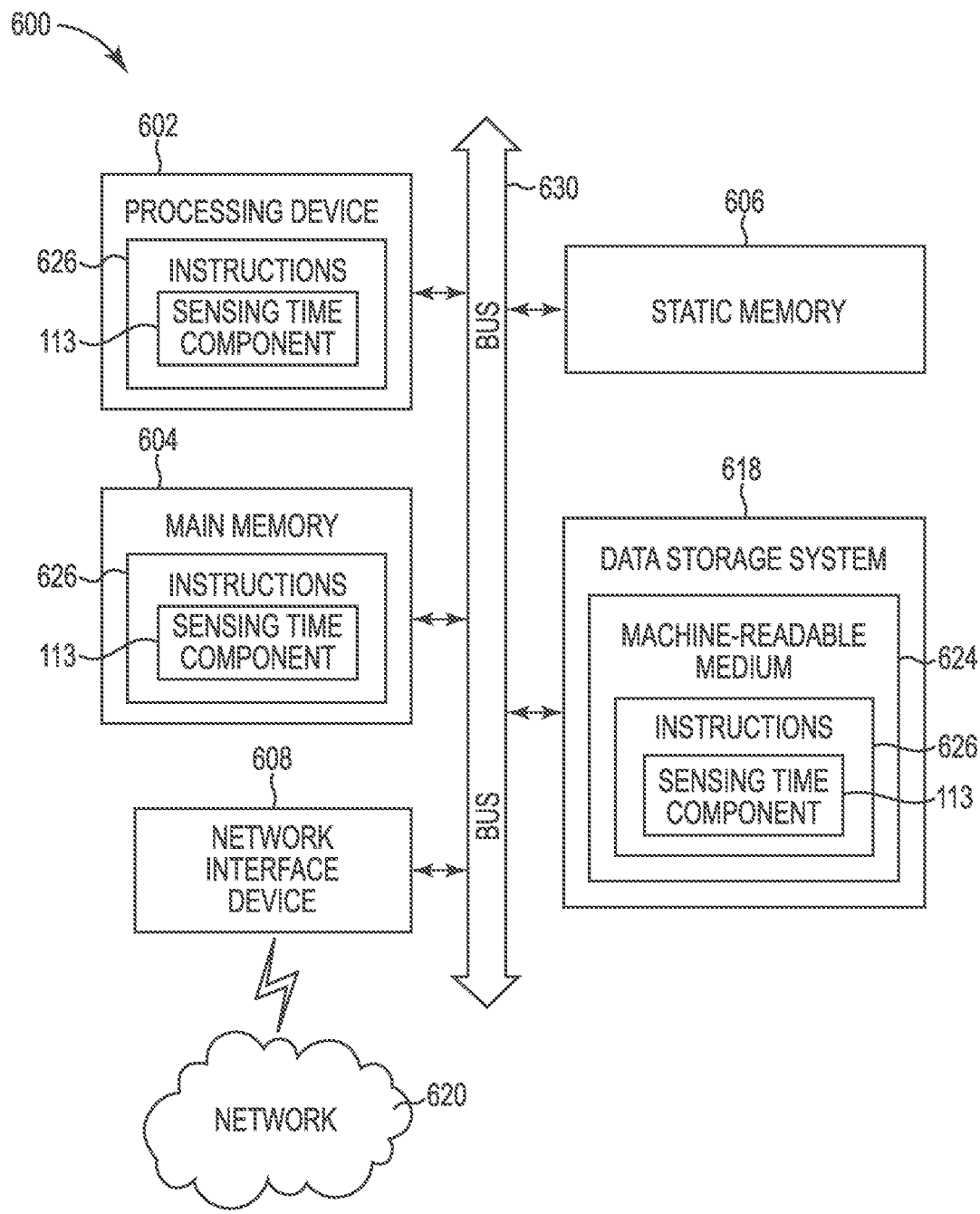
FIG. 6 is a block diagram of an example computer system in which embodiments of the disclosure may operate.

FIG. 6 is a block diagram of an example computer system 600 in which embodiments of the disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sensing time component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a sensing time component (e.g., the sensing time component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer).

In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    determining that a program operation includes a first pass to apply a first voltage distribution to a plurality of memory cells and a second pass to apply a second voltage distribution to the plurality of memory cells;
    performing the first pass of the program operation using a first sensing time;
    performing the second pass of the program operation using a second sensing time, wherein the first sensing time is shorter than the second sensing time; and
    applying a corresponding sensing time to a plurality of additional passes of the program operation based on a sequence of the additional passes of the program operation.

2. The method of claim 1, wherein the first pass of the program operation is a coarse program operation and the second pass of the program operation is a fine program operation.

3. The method of claim 1, comprising performing the program operation from a source region of the plurality of memory cells to a drain region of the plurality of memory cells.

4. The method of claim 1, comprising performing the program operation from a drain region of the plurality of memory cells to a source region of the plurality of memory cells.

5. A method comprising:
    determining that a program operation includes a first pass to apply a first voltage distribution to a plurality of memory cells and a second pass to apply a second voltage distribution to the plurality of memory cells;
    performing the first pass of the program operation using a first sensing time; and
    performing the second pass of the program operation using a second sensing time, wherein the first sensing time is shorter than the second sensing time;
    altering a program voltage associated with the first pass of the program operation to a second program voltage when performing the second pass of the program operation; and
    increasing the program voltage associated with the first pass of the program operation for threshold voltage states associated with the plurality of memory cells that have greater than a particular threshold voltage associated therewith or decreasing the first sensing time for the threshold voltage states associated with the plurality of memory cells that have greater than the particular threshold voltage associated therewith, or both.

6. The method of claim 5, wherein the first sensing time is at least twenty-five percent less than the second sensing time.

7. The method of claim 5, performing using the second sensing time in response to determining that the first pass of the program operation is complete.

8. An apparatus, comprising:
    a non-volatile memory comprising non-volatile memory blocks; and
    a controller configured to:
        identify a plurality of programming passes to be performed on the non-volatile memory blocks during a programming operation;
        determine a first type of a first programming pass of the plurality of programming passes;
        control performance of the first programming pass using a first sensing time based on the first type;
        determine a second type of a second programming pass of the plurality of programming passes; and
        control performance of the second programming pass using a second sensing time based on the second type.

9. The apparatus of claim 8, wherein the controller is further configured to determine a plurality of corresponding sensing times for each of the plurality of programming passes.

10. The apparatus of claim 9, wherein the plurality of corresponding sensing times are each different sensing times that correspond to each of the plurality of programming passes.

11. The apparatus of claim 8, wherein the first type and the second type correspond to a sequence of a corresponding programming pass.

12. The apparatus of claim 8, wherein the controller is further configured to increase a programming voltage associated with the first programming pass for threshold voltage states associated with memory cells of the non-volatile memory blocks that are greater than a threshold voltage.

13. The apparatus of claim 12, wherein the controller is further configured to increase a voltage step for the threshold voltage states associated with the plurality of memory cells that are greater than the threshold voltage.

14. The apparatus of claim 13, wherein the first sensing time is decreased in response to the controller increasing the voltage step.

15. A system comprising:
a memory sub-system comprising a non-volatile memory device that comprises non-volatile memory blocks; and
a processing device coupled to the memory sub-system, wherein the processing device is configured to:
determine a programming operation is to be performed on the non-volatile memory blocks;
determine a first program pass of the programming operation is a coarse program pass;
decrease a sensing time from an initial sensing time for the first program pass in response to the first program pass being the coarse program pass;
increase a step program voltage for the first program pass after a threshold level in response to the first program pass being the coarse program pass;
determine a second program pass of the programming operation is a fine program pass; and
apply the initial sensing time for the second program pass in response to the second program pass being the fine program pass.

16. The system of claim 15, wherein the processing device is further to maintain the step program voltage for the second program pass after the threshold level in response to the second program pass being the fine program pass.

17. The system of claim 15, wherein the step program voltage is increased during the first program pass from a first step voltage prior to the threshold voltage to a second step voltage over the threshold voltage, wherein the first step voltage is half of the second step voltage.

18. The system of claim 15, wherein the initial sensing time is a default sensing time for the programming operation.

* * * * *